(12) United States Patent
Byeon et al.

(10) Patent No.: US 6,542,406 B2
(45) Date of Patent: Apr. 1, 2003

(54) ROW DECODER OF A NOR-TYPE FLASH MEMORY DEVICE

(75) Inventors: Dae-Seok Byeon, Seoul (KR); Myung-Jae Kim, Kyunggi-do (KR); Young-Ho Lim, Kyunggi-do (KR); Seung-Keun Lee, Kyunggi-do (KR)

(73) Assignee: Samsung Electronics Co. Ltd., Kyungki-Do (KR)

( * ) Notice: Subject to any disclaimer, the term of this patent is extended or adjusted under 35 U.S.C. 154(b) by 0 days.

(21) Appl. No.: 09/905,612

(22) Filed: Jul. 13, 2001

(65) Prior Publication Data

US 2002/0067639 A1 Jun. 6, 2002

(30) Foreign Application Priority Data

Jul. 13, 2000 (KR) .............................................. 00-40212
Nov. 20, 2000 (KR) .............................................. 00-68999

(51) Int. Cl.⁷ .............................................. G11C 16/04
(52) U.S. Cl. ............................ 365/185.13; 365/185.09; 365/185.11
(58) Field of Search ........................ 365/185.13, 185.11, 365/185.09, 185.01

(56) References Cited

U.S. PATENT DOCUMENTS 5,621,690 A * 4/1997 Jungroth et al. ........ 365/185.09
5,808,945 A * 9/1998 Arase .......................... 365/200

* cited by examiner

*Primary Examiner*—Hoai Ho
(74) *Attorney, Agent, or Firm*—Marger Johnson & McCollom P.C.

(57) ABSTRACT

A nonvolatile semiconductor memory device includes a plurality of first wordlines, a plurality of second wordlines coupled to memory cells, the second wordlines being assigned to each of memory sectors, a plurality of transistors each of which connects a first wordline to a second wordline, and a circuit for controlling the transistors in common. One of the first wordlines is connected to one of the second wordlines through one of the transistors. A circuit area for decoding is reduced and current consumption is minimized.

9 Claims, 8 Drawing Sheets

ROW DECODER OF A NOR-TYPE FLASH MEMORY DEVICE

This application relies for priority upon Korean Patent Applications Nos. 2000-40212, filed on Jul. 13, 2000 and 2000-68999, filed on Nov. 20, 2000, the contents of which are herein incorporated by reference in their entirety.

FIELD OF THE INVENTION

The invention generally relates to a semiconductor memory device and, more specifically, to a NOR-type flash memory device having a row decoder that occupies a smaller layout area over the memory device.

BACKGROUND OF THE INVENTION

Semiconductor memory devices are classified into volatile and nonvolatile types. The volatile semiconductor memory devices cannot retain data stored in their memory cells when a power is turned off, while the nonvolatile memory devices hold their data even during a power-off period. The nonvolatile memory devices are useful for applications that require stable data retention facilities or for portable systems.

As one of the nonvolatile memory devices, a NOR-type flash memory device employs EPROM (erasable and programmable read-only memory) cells, also referred to as flash EEPROM cells. The flash EEPROM cell is formed of a cell transistor as shown in FIG. 1. The cell transistor is typically constructed of n-type source and drain regions 2 and 3 formed in a p-type semiconductor substrate 1 or a bulk region and spaced apart from each other as shown. The cell transistor also includes a floating gate 4 formed over a channel region between the source and drain regions and a control data 5 stacked over the floating gate 4. The floating gate 4 is electrically isolated from the channel region through an oxide film, and an intermediate isolation film is interposed between the floating and control gates. The source region 2 is connected to a source line SL, and the drain region 3 is connected to a bitline BL. The control gate 5 is connected to a wordline WL.

FIG. 2 shows a construction of a conventional NOR flash memory device. A memory cell array is divided into a plurality of memory sectors 10 each of which includes a plurality of the EEPROM cells arranged in a matrix of rows controlled by wordlines WLX where x=0,1 . . . m columns (controlled by bitlines not shown in FIG. 2.). A global wordline decoder 12 is arranged to select global wordlines GWL0~n extending over the memory sectors 10, and a plurality of local decoder groups 14 are arranged to correspond with a plurality of the memory sectors 10. Sector predecoders 16 are disposed to correspond with the local decoder groups 14 (and the memory sectors 10).

The global wordlines are sourced or driven by the global wordline decoder 12, with each of the global wordlines coupled to a plurality of local decoders in each row. The wordlines of each memory sector 10, WL0~WLm, are subdivided into plural segments each of which in turn has plural wordlines (e.g., eight wordlines). Each of the local decoders is assigned to one of the segments of wordlines for each memory sector 10. Therefore, the wordlines of a segment, e.g., WL0~WL7, are connected in common to their corresponding local decoder LD1~LDn. Each sector predecoder 16 applies selection signals S1 (i=0~8) to the local decoders LD0~LDn to charge a corresponding one of the memory sectors 10.

A typical local decoder (e.g. LD0), as shown in FIG. 3, is constructed of units LDU0~LDU7 each of which corresponds to one of the segmented wordlines WL0~WL7. A given unit, e.g. LDU0, is formed of a transmission gate TG0 and a NMOS transistor MN0 responsive to one of the global wordlines, e.g. GWL0. The transmission gates TG0~TG7 transfer the selection signals S0~S7 to the wordlines WL0~WL7 in response to a signal (i.e. a global wordline decoding signal) on the global wordline GWL0, and the NMOS transistors MN0~MN7 transfer an erasure voltage Vex to the wordlines WL0~WL7 in response to the global decoding signal supplied through the global wordline GWL0.

In programming and erasing the NOR flash device, bias voltages are supplied to the global wordlines, the segmented wordlines, and the selection signals as illustrated in TABLE 1 below.

TABLE 1

| Operation mode | GWL | | Selected Sector | | | | Unselected Sector | | | |
|---|---|---|---|---|---|---|---|---|---|---|
| | Sel. WL | Unsel. WL | Sel. Si | Unsel. $S_1$ | Sel. WL | Unsel. WL | Vex | Si | WL | Vex |
| Program | 9 V | 0 V | 9 V | 0 V | 9 V | 0 V | 0 V | 0 V | 0 V | 0 V |
| Read-out | 4.5 V | 0 V | 4.5 V | 0 V | 4.5 V | 0 V | 0 V | 0 V | 0 V | 0 V |
| Erasure | −9 V | | 0 V | | −9 V | | −9 V | 0 V | 0 V | 0 V |

The programming operation is performed by selecting one of the global wordlines and one of the selection signals from the sector predecoders 16. The selected global wordline, e.g., GWL0, is charged up to 9V while the unselected global wordlines GWL1~GWLn are set to 0V. The selected selection signal, e.g. S0, is charged to 9V while the unselected selection signals S1~S7 are held to 0V. The erase voltage Vex is maintained at 0V during programming.

Regarding the selected global wordline GWL0 with the bias conditions shown in TABLE 1, the transmission gates TG0~TG7 are turned on while the NMOS transistors MN0~MN7 are turned off. Then, the activated selection signal S0 of 9V is driven into the wordline WL0 through the transmission gate TG0, while the other wordlines WL1~WL7 (deselected) are connected to the selection signals S1~S7 of 0V through the transmission gates TG1~TG7. As for the unselected global wordlines GWL1~GWLn, their corresponding wordlines are connected to the erase voltage Vex of 0V (inactive) through the NMOS transistors MN0~MN7 while the transmission gates TG0~TG7 are being turned off.

The read-out operation is performed at 4.5V, instead of 9V in the programming operation. The 4.5V read-out voltage is established on the selected global wordline GWL0 and on selection signal S0.

The erase operation is carried out sector by sector. Memory cells in a sector are erased in a unit cycle of the erasure operation. As shown in TABLE 1, the global wordlines GWL0~GWLn are charged to −9V and the selection signals S0~S7 are set to 0V. The erase −9V Vex voltage is applied to the local decoders. The transmission gates TG0~TG7 are turned off while the NMOS transistors MN0~MN7 are turned on to drive Vex of −9V onto the wordlines WL0~WL7. Then, the wordlines of a selected sector are charged to the −9V bias voltage.

However, the local decoder shown in FIG. 3 needs three MOS transistors, including two for the transmission gate, to operate one wordline for programming, reading-out, and erasing. As a result, the circuit area occupied by the local row decoders undesirable increases the layout dimension and chip size.

SUMMARY OF THE INVENTION

Accordingly, it is an object of the invention to provide a nonvolatile semiconductor memory device having row decoders that occupy a smaller area therein.

In order to achieve the object of the invention, a nonvolatile semiconductor memory device includes a plurality of first wordlines, a plurality of second wordlines coupled to memory cells, the second wordlines being assigned to each of memory sectors, a plurality of transistors each of which connects the first wordline to the second wordline, and a circuit for controlling the transistors in common. One of the first wordlines is connected to one of the second wordlines through one of the transistors.

The transistor is a depletion type having a negative threshold voltage. The device also has a redundant memory sector formed of a plurality of redundant memory cells which are coupled to redundant wordlines, the redundant wordlines being each connected to the first wordlines through corresponding transistors, and a circuit for controlling the transistors in common.

A decoding circuit for selecting the first wordlines includes a loop (by which is meant the fuse 126 that is arranged parallel with a VERn-gated transistor 127 in FIG. 5) to isolate the first wordline from a voltage source when the first wordline is involved in a defective cell. The decoding circuit includes an electrical path to set the first wordline at a predetermined voltage level even when the first wordline is involved in the defective cell.

Another aspect of the invention involves further reducing current consumption for pumping high voltages. A nonvolatile semiconductor memory device includes a plurality of first wordlines, a plurality of second wordlines coupled to the memory cells, the second wordlines being assigned to a corresponding one of the memory sectors, a first group of transistors for connecting a first group of the first wordlines to a first group of the second wordlines, a second group of transistors for connecting a second group of the first wordlines to a second group of the second wordlines, a first circuit for controlling the first group of the transistors in common, and a second circuit for controlling the second group of the transistors in common. One of the first wordlines is connected to one of the second wordlines through one of the transistors.

BRIEF DESCRIPTION OF THE DRAWINGS

For a better understanding of the invention, and to show how embodiments of the same may be carried into effect, reference will now be made, by way of example, to the accompanying diagrammatic drawings, in which.

DESCRIPTION OF THE PREFERRED EMBODIMENT

Figure 1:
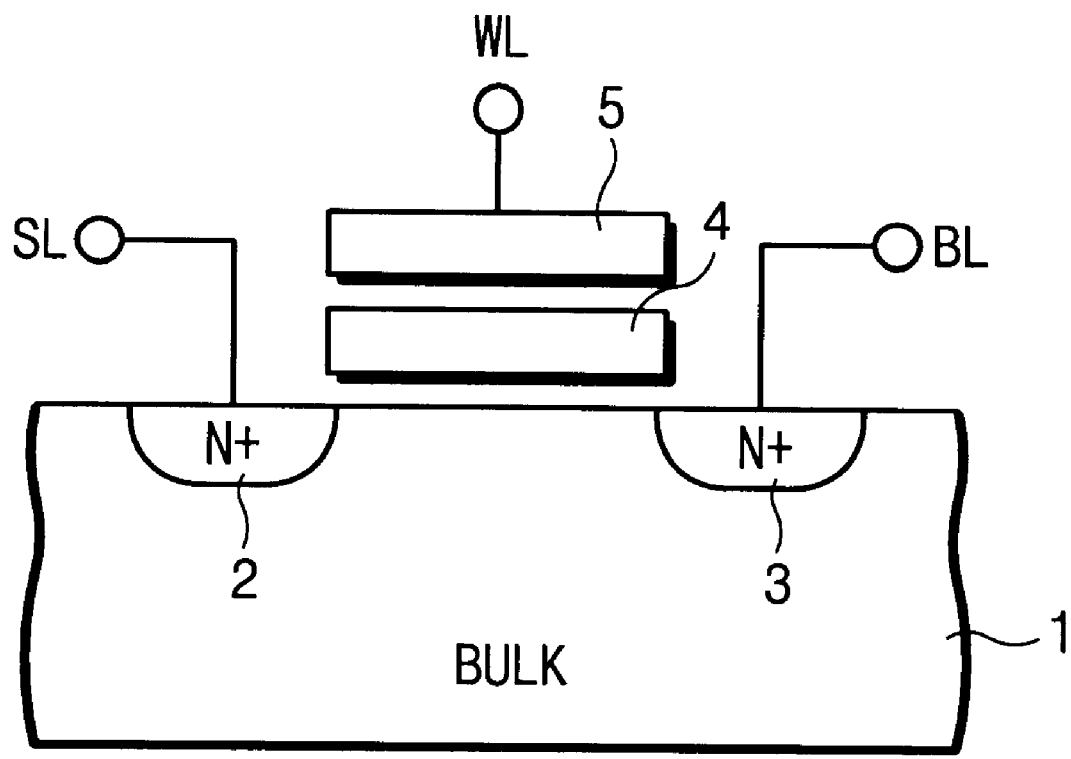
FIG. 1 is a sectional diagram of a conventional EEPROM cell.
Figure 2:
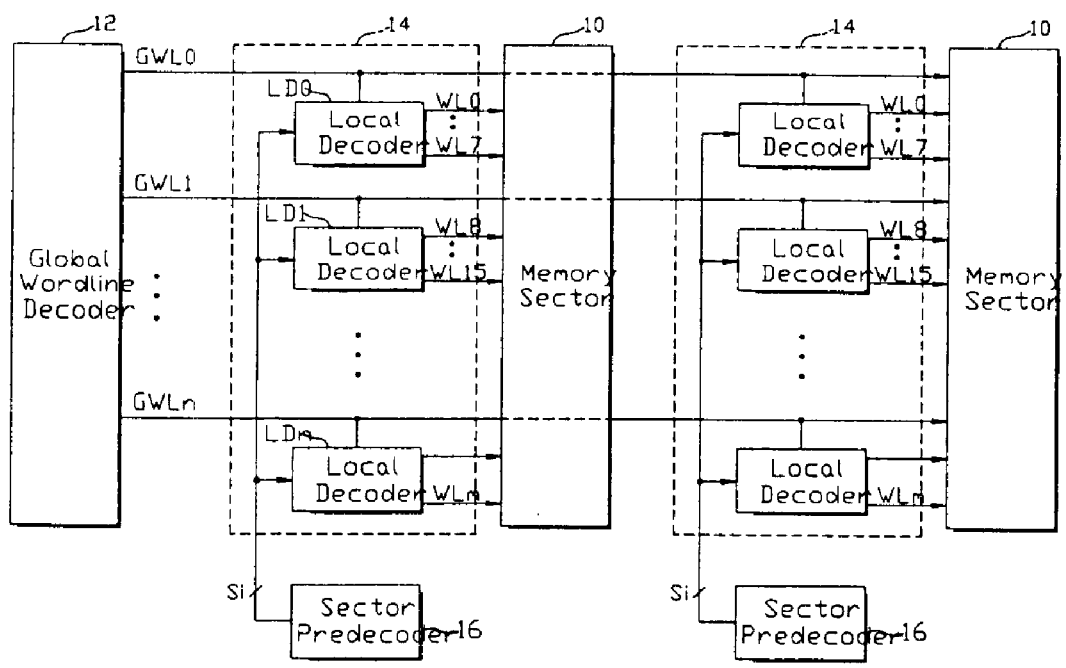
FIG. 2 is a block diagram of a conventional flash memory device.
Figure 3:
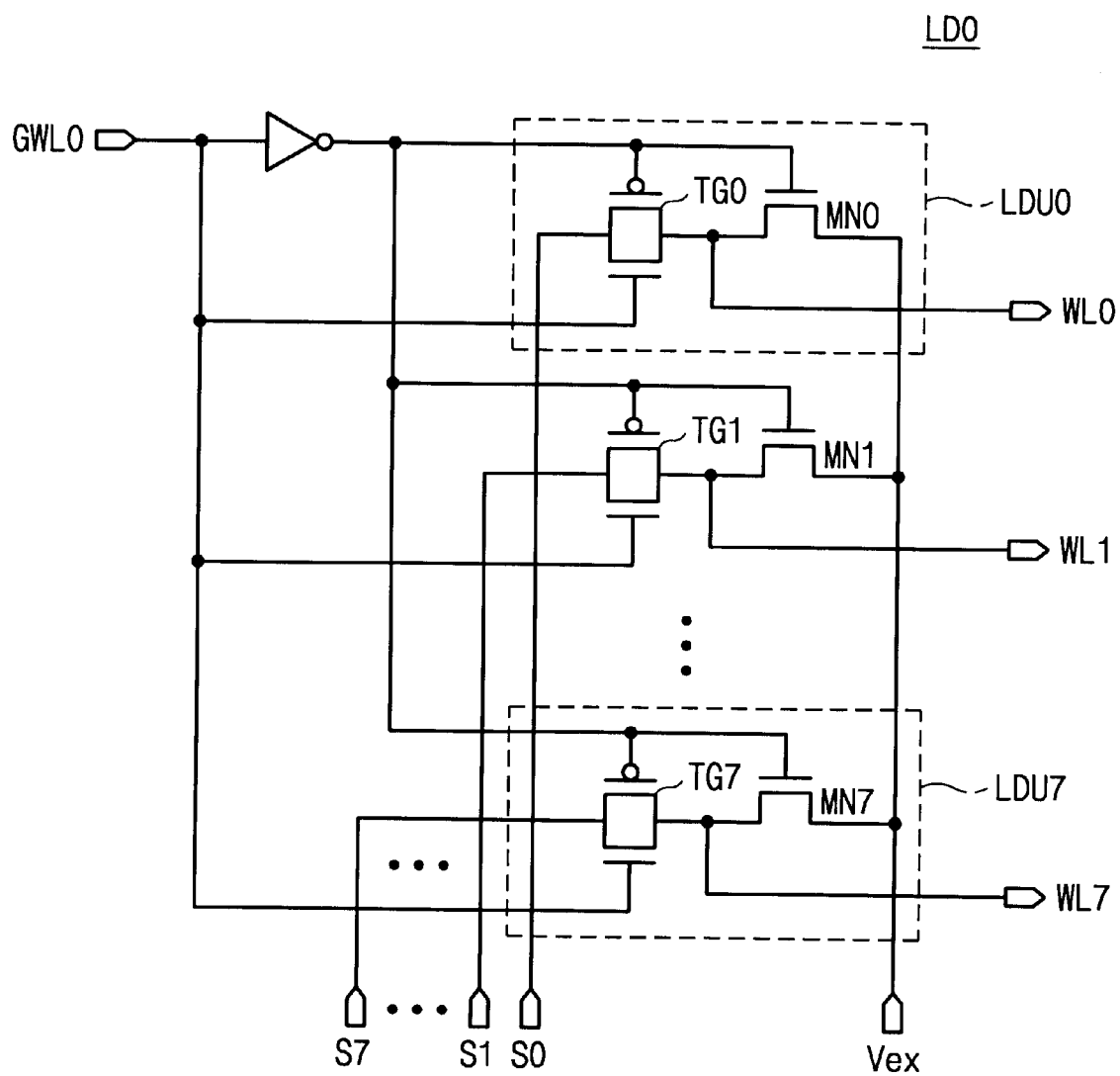
FIG. 3 is a circuit diagram of a local decoder shown in FIG. 2.
Figure 4:
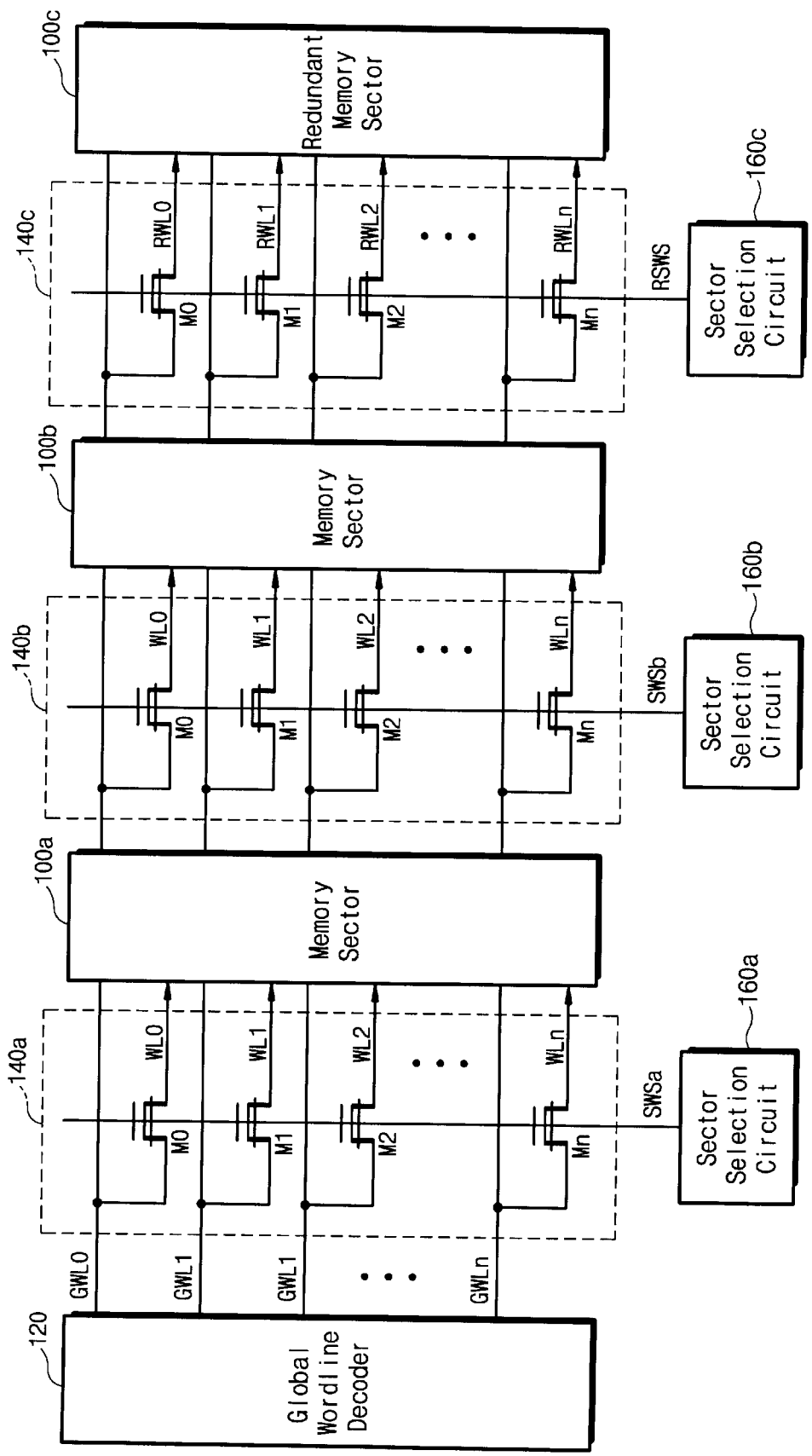
FIG. 4 is a block diagram of a flash memory device according to the invention.

Referring to FIG. 4, a memory cell array of the invented memory device is divided into a plurality of memory sectors, e.g. 100a and 100b. Together with the memory sectors, one or more redundant memory sectors 100c are also provided in the memory cell array for 'repairing' defective memory cells, as is known. Each of the sectors is constructed of a plurality of memory cells arranged in a matrix of rows (or wordlines) and columns (or bitlines). A plurality of global wordlines GWL0~GWLn extend from global wordline decoder 120 through the normal memory sectors 100a and 100b and the redundant memory sector 100c. Local decoders 140a–140c are arranged by each of the sectors 100a–100c to drive local wordlines WL0~WLn. The number of the global wordlines GWL0~GWLn is identical to that of the local wordlines WL0~WLn.

Each of the local decoders has a plurality of switching transistors M0~Mn, which preferably are made of high-voltage adaptable NMOS depletion transistors. The switching transistors M0~Mn connect the global wordlines GWL0~GWLn to the local wordlines WL0~WLn in the local decoder 140a or 140b and also connect the global wordlines to redundant wordlines RWL0~RWLn in the local decoder 140c. The gates of the switching transistors M0~Mn belonging to one local decoder are commonly coupled to their corresponding selection signal (e.g. SWSa) generated by a corresponding sector selection circuit (e.g. 160a). Gates of the switching transistors of the local decoder 140b are coupled to selection signal SWSb generated from sector selection circuit 160b, and gates of the switching transistors of the local decoder 140c are coupled to selection signal RSWS generated from sector selection circuit 160c. The local decoder 140c and the redundant sector selection circuit 160c are provided to operate the redundant memory sector 100c.

Figure 5:
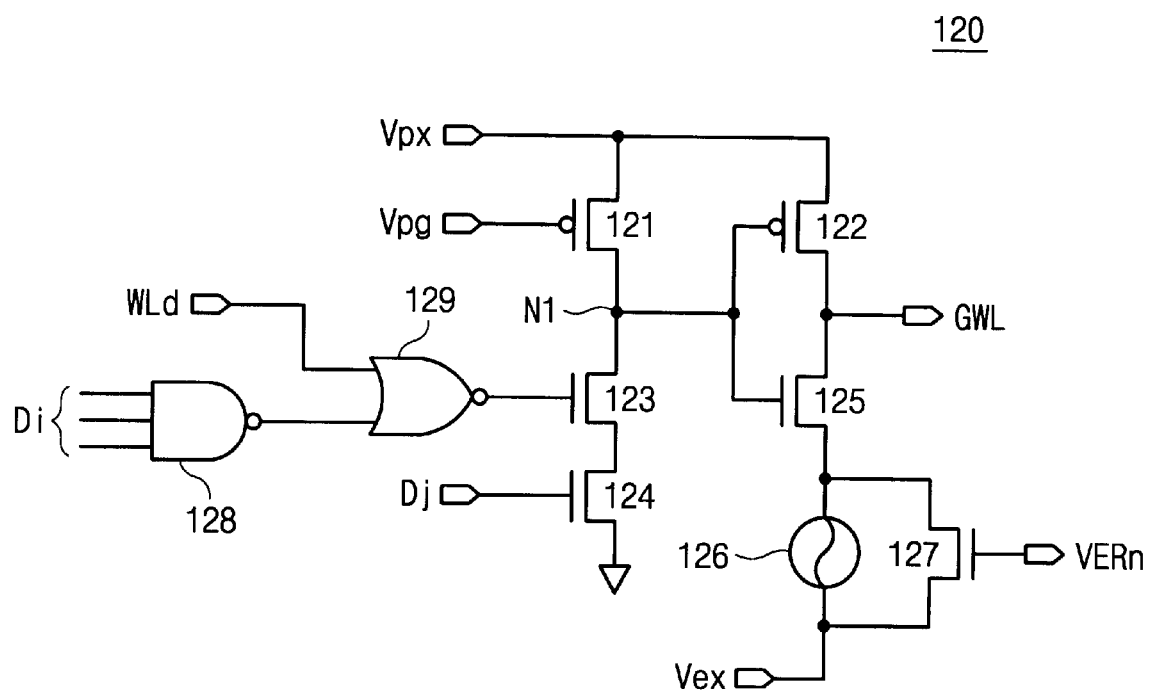
FIG. 5 is a circuit diagram of the global wordline decoder shown in FIG. 4.

The global wordline decoder unit 120 is constructed as shown in FIG. 5. The unit of FIG. 5 corresponds to one global wordline, the others being nearly identical in accordance with a preferred embodiment of the invention. A NOR gate 129 receives wordline disable signal WLd and an output of a NAND gate 128 that receives decoded signals Di from a row predecoder (not shown). A PMOS transistor 121 connects a program voltage Vpx to node N1 in response to a gating voltage Vpg. Between the node N1 and a ground are NMOS transistors 123 and 124 connected in series. The gate of the NMOS transistor 124 is coupled to decoded signal Dj also supplied from the row predecoder. The node N1 is also coupled to gates of a pair of PMOS and NMOS transistors 122 and 125. The PMOS transistor 122 is connected between the program voltage Vpx and one of the global wordlines GWL (i=0~n). The NMOS transistor 125 is connected to erase voltage Vex through a fuse 126. Between both ends of the fuse 126, an NMOS transistor 127 is connected, the transistor's gate being coupled to a negative erase voltage VERn.

The PMOS transistor 122 transfers the program voltage Vpx into the corresponding global wordline during a programming operation, and the NMOS transistor 125 supplies the erase voltage Vex during an erasing operation, in response to the logic states of the decoded signals Di and Dj. The fuse 126 and the NMOS transistor 127 prevent supply of an erase voltage onto a global wordline that may be connected with one or more defective memory cells, during an erasing operation.

For programming or read-out operation, the output of the NAND gate 128 is set at a low level and Dj turns on the NMOS transistor 124. As the inputs of the NOR gate 129 are all at low levels, the node N1 assumes a low level and thereby Vpx is driven onto the global wordline selected therein. With the unselected global wordline (WLd at a logic high level), regardless of whether the output of the NAND gate 128 or Dj is high level or low level, the node N1 goes to high level and thereby Vex is connected to the unselected global wordline through the NMOS transistor 125. The configurations of voltages and signals which are applied into the global wordlines according to various operational modes are summarized in TABLEs 2 and 3 below.

thereby the defective global wordline is connected to Vex. In the erasure operation mode, the signal VERn is set on a negative voltage level, e.g. −9V, to turn the NMOS transistor 127 off in order to prevent supply of Vex to the defective global wordline. Undesirable supply of Vex to the defective global wordline during the erasure operation mode causes an over-erasure for memory cells coupled to the local wordline which is connected to the defective global wordline. Such an over-erasure may result in a program failure due to leakage current flow by charges on a bitline through the over-erased memory cells.

Figure 6:
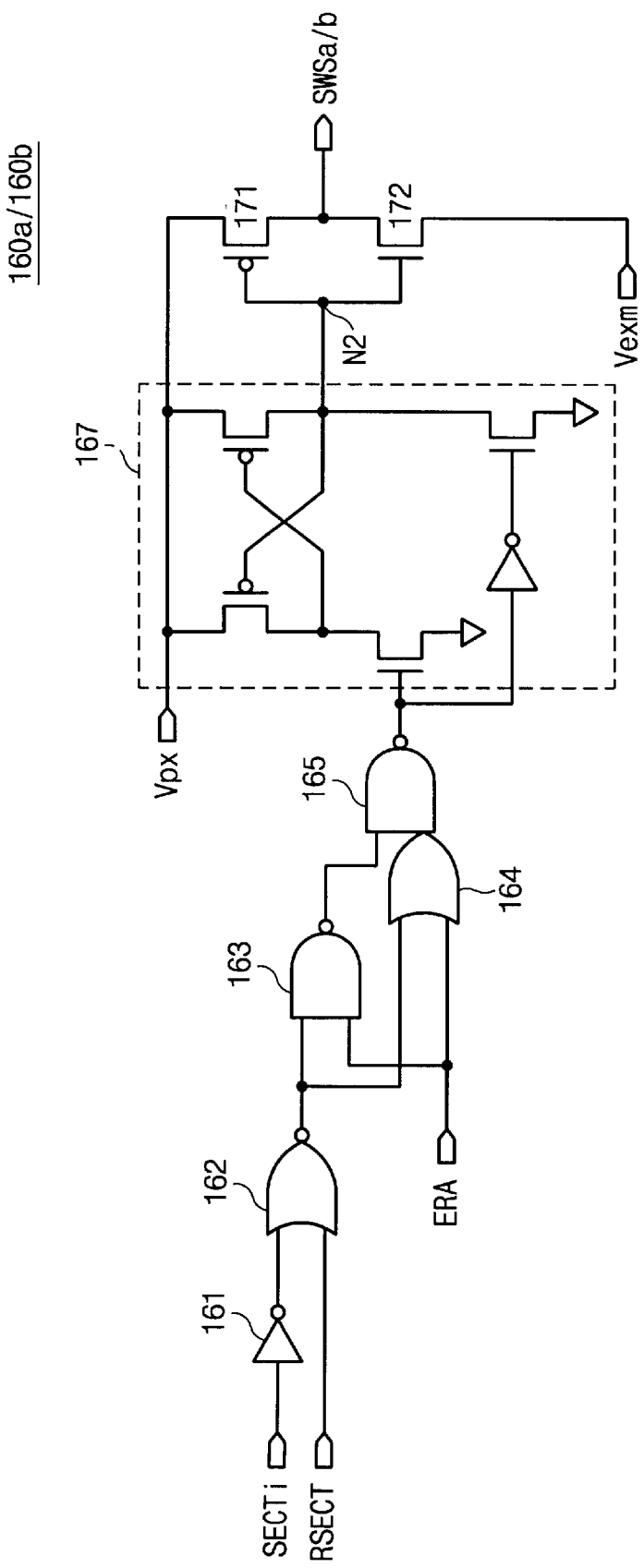
FIG. 6 is a circuit diagram of a normal sector selector shown in FIG. 4.

Referring to FIG. 6, the sector selection circuit 160a (or 160b) generates sector selection signal SWSa (or SWSb) that is charged to Vpx or Vexm in response to sector enable signal SECTi, redundant sector enable signal RSECT, and erasure enable signal ERA. A NAND gate 163 receives an output of NOR gate 162 the inputs of which include an inverted version of SECTi and RSECT, and the erasure enable signal ERA. The output of the NOR gate 162 and ERA are applied to OR gate 164. Outputs from the NAND and OR gates 163 and 164 are applied to NAND gate 165 whose output is applied to a level shifter 167. An output of the level shifter 167, node N2, is applied to the gates of PMOS and NMOS transistors 171 and 172. The PMOS transistor 171 is connected between Vpx and SWSa (or SWSb), and the NMOS transistor 172 is connected between SWSa (or SWSb) and Vexm. Vexm is a negative voltage applied to the local decoder assigned to a selected memory sector in the erasure operation mode. Vexm is supplied from a level shifter (not shown, as will be understood).

TABLE 2

| Operation | GWL | | Selected Sector | | | Unselected Sector | | |
|---|---|---|---|---|---|---|---|---|
| mode | Sel. | Unsel. | SWSi | Sel. GWL | Unsel. GWL | SWSi | Sel. WL | Unsel. WL |
| Program | 9 V | 0 V | 9 V | 9 V | 0 V | 0 V | 0 V | ~\| Vtmp |
| Read-out | 4.5 V | 0 V | 4.5 V | 4.5 V | 0 V | 0 V | 0 V | ~\| Vtmp |
| Erase | | −9 V | 0 V | | −9 V | −11 V | | Floating |

As mentioned above, since the global wordlines are arranged in correspondence with the local wordlines and a given memory sector, it is possible to substitute the global wordlines with the redundant wordlines RWL0~RWLn, using the global decoder as shown in FIG. 5, in order not to select a defective cell during programming, reading, or erasing. If there is a defect in a cell associated with one of the global wordlines, the fuse 126 involved in the defective global wordline is blown or opened. The wordline disable signal WLd goes to a high level and the voltage signal VERn becomes high level (or Vcc) as shown in TABLE 3, during the programming and read-out operation modes.

If RSECT is low level (i.e. the redundant memory sector is not selected) and SECTi and ERA are high levels, in order to select an alternative one of the memory sectors, then the NMOS transistor 172 is turned on and thereby the selection signal SWSa (or SWSb) is driven with Vexm. While in an unselected state (i.e. the redundant memory sector is not selected), when RSECT and SECTi are low levels and ERA is high level, the PMOS transistor 171 is turned on and thereby SWSa (or SWSb) is connected to Vpx. The selection signal SWSa (or SWSb) has different voltage levels in accordance with the logic states of selection. Namely, in the erasure operation mode, for example, the selection signal

TABLE 3

| Operation | | | | | Fuse's not Blown | | Fuse's Blown | |
|---|---|---|---|---|---|---|---|---|
| mode | Vpx | Vex | Vpg | VERn | Sel. WL | Unsel. WL | Sel. GWL | Unsel. GWL |
| Program | 9 V | 0 V | 9 V | Vcc | 9 V | 0 V | 0 V | 0 V |
| Read-out | 4.5 V | 0 V | 4.5 V | Vcc | 4.5 V | 0 V | 0 V | 0 V |
| Erase | 0 V | −9 V | −9 V | −9 V | | −9 V | | 0 V |

Thus, the NMOS transistor 123 is turned off without regard to the states of the decoded signals Di and Dj, and SWSa is set to Vexm at about −11V when its corresponding memory sector 100a is selected, while the selection signal SWSb remains at 0V because its corresponding memory sector 100*b* is not selected.

Figure 7:
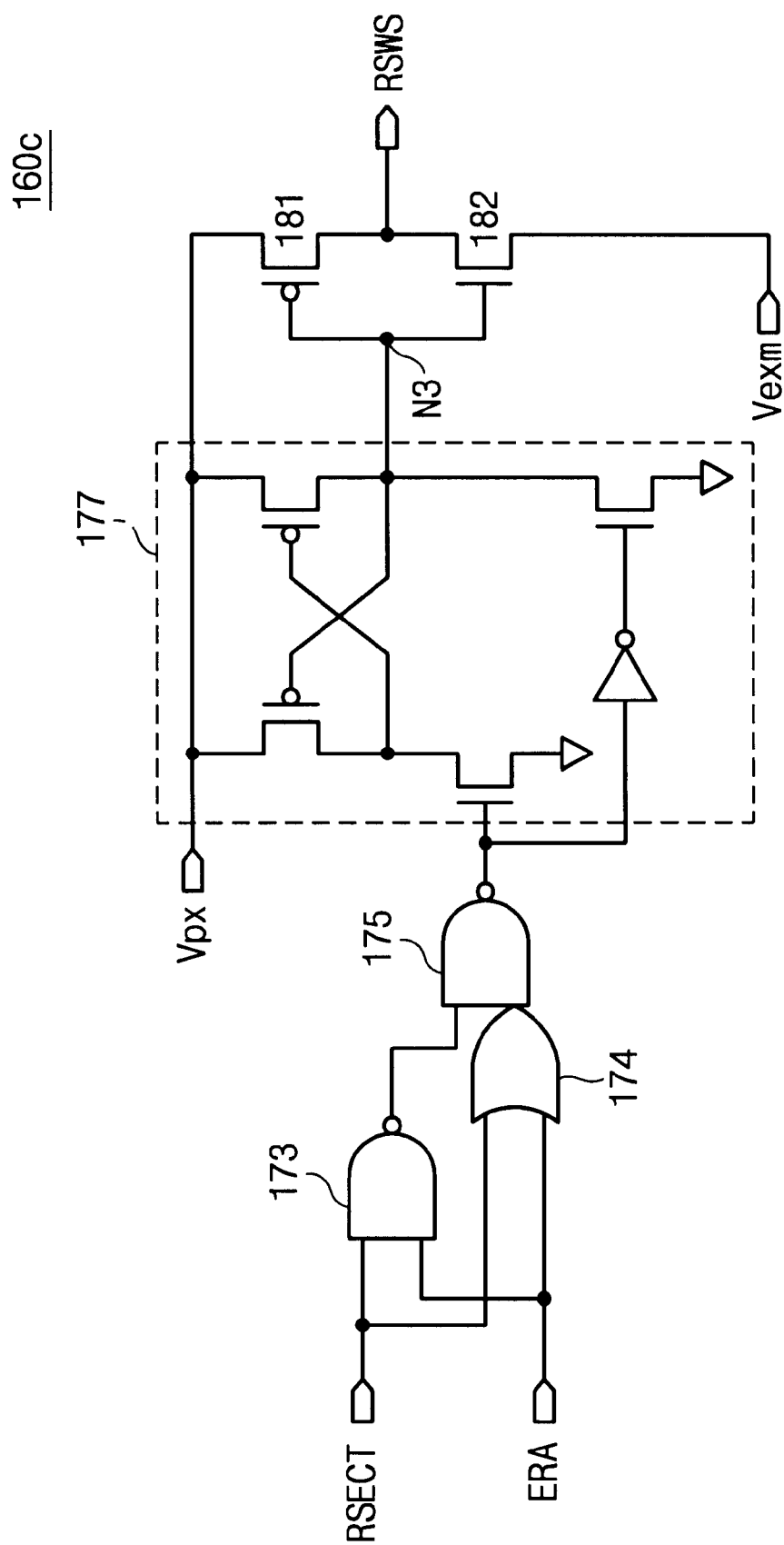
FIG. 7 is a circuit diagram of a redundant sector selector shown in FIG. 4.

Referring to FIG. 7, the redundant sector selection circuit 160*c* responds to the redundant sector enable signal RSECT and the erasure enable signal ERA to generate the redundant sector selection signal RSWS. RSECT and ERA are applied to NAND gate 173 and to OR gate 174. The output of a NAND gate 175 (receiving outputs from the gates 173 and 174) is applied to a level shifter 177 whose output node N3 is coupled to a pair of PMOS and NMOS transistors 181 and 182. The PMOS transistor 181 is connected between Vpx and RSWS, and the NMOS transistor 182 is connected between RSWS and Vexm. During the programming and read-out operation modes, an alternative one of Vpx and Vexm is driven onto RSWS in response to a selection state determined by RSECT and ERA.

Now, referring to FIGS. 5 through 7 and to TABLEs 2 and 3, explanations for the read-out, programming and erasure operations will proceed with the assumption that the memory sector 100*a* is selected while the memory sector 100*b* is not selected.

In the programming/read-out operation mode (hereinafter, "/" means "or"), and assuming that the global wordline GWL0 is selected, GWL is charged to 9V (for programming)/4.5V (for reading-out) while the unselected global wordlines GWL1~GWLn are set on 0V. The sector selection circuit 160*a* generates SWSa of 9V/4.5V while the other sector selection circuit 160*b* generates SWSb of 0V. Thus, the 9V/4.5V level, which is the wordline voltage for programming/reading-out a selected memory cells, is applied to the local wordline WL0 from the selected global wordline GWL0 through the switching transistor M0. If the fuse 126 has been blown by the presence of a defective global wordline, the selected global wordline is connected to Vex of 0V through the NMOS transistor 127. Such a biasing for the defective global wordline with 0V secures a stable operation over other memory cells (not defective) coupled to the defective global wordline. Meanwhile, at the local decoder 140*b* that is assigned to the unselected memory sector 100*b*, since gate voltages of the switching transistor of the depletion type are 0V, the wordline WL0 of the local decoder 140*b* is charged up to the absolute threshold value ½Vtnp½ of the depletion transistor M0. But, it will be understood that there is no influence to the programming and reading operations due to the charging of the unselected WL0. This is because a column decoder corresponding to the unselected memory sector 100*b* is held in a disable state. In the erasure operation mode in which one cycle of erasure effects erasure by sector, all of the global wordlines GWL0~GWLn are charged to −9V and then the local wordlines of the selected memory sector 100*a* are set to −9V. The local wordlines of the unselected memory sector 100*b* are floated (i.e. unbiased). The selected sector selection circuit 160*a* generates SWSa of 0V to transfer the −9V (Vex) into the local wordlines WL0~WLn of the selected sector 100*a* through the switching transistors M0~Mn. If the fuse 126 has been blown by the presence of a defective global wordline, the erasure voltage Vex of −9V is not applied to the defective global wordline because the NMOS transistor 127 is turned off by VERn of −9V. While the erasure operation progresses through the memory cells of the selected sector 100*a*, it needs to prevent the Vex of −9V from being applied onto the local wordlines assigned to the unselected memory sector 100*b*. For that purpose, the sector selection circuit 160*b* for the unselected sector 100*b* generates SWSb having the −11 V voltage level of Vexm corresponds to a −2V threshold voltage of the depletion switching transistor. The depletion switching transistors of the unselected local decoder 140*b* are all turned off by SWSb of −11V, which causes the unselected local wordlines to float and causes Vex not to be input to them. Operations with the redundant sector 100*c* and its surrounding circuitry are similar to those with the aforementioned during the programming, read-out, or erasure operation modes in the case of that the fuse 126 of the global wordline decoder 120 is not blown. But if the fuse 126 has been blown in the global wordline decoder 120 of FIG. 6, as shown in the TABLE 3, there is no supply of effective programming, read-out or erase voltages either to the selected or unselected global wordlines.

Figure 8:
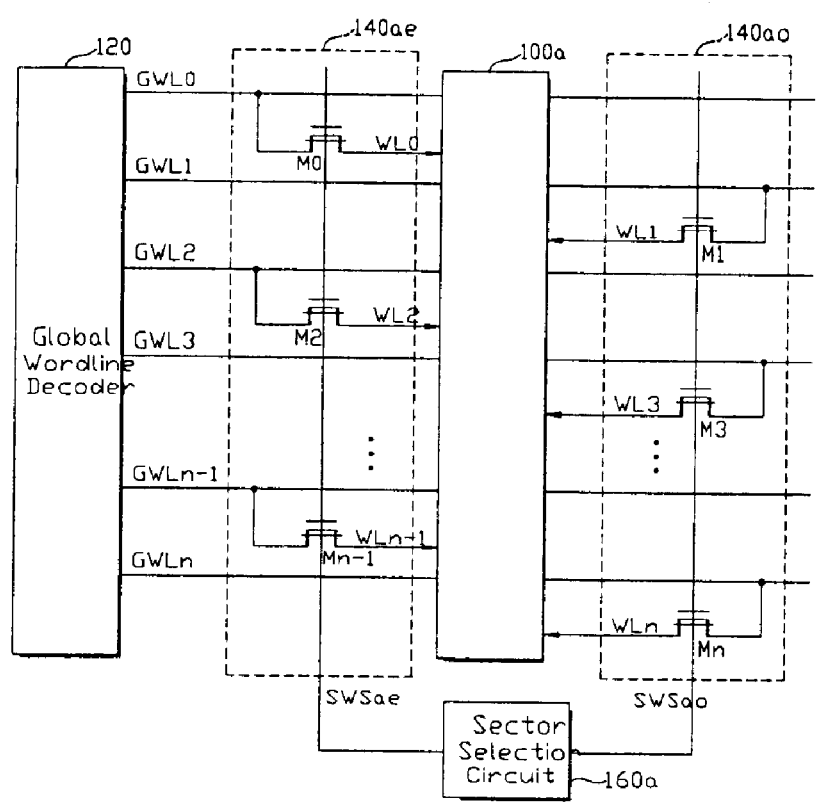
FIG. 8 is a block diagram of a flash memory device according to another embodiment of the invention.

FIG. 8 shows another embodiment of the local decoders and the sector selection circuit. The local decoder (e.g., 140*a* of FIG. 4) is divided into two sections 140*ae* and 140*ao*, i.e. even and odd sections. The even section 140*ae* is assigned to even-numbered local wordlines WL0, WL2, . . . , and WLn-1 while the odd section 140*ao* is assigned to odd-numbered local wordlines WL1, WL3, . . . , and WLn. The even-numbered local wordlines WL0, WL2, . . . , and WLn-1 are connected to the even-numbered global wordlines GWL0, GWL2, . . . , and GWLn-1 through the even-numbered depletion switching transistors M0, M2, . . . , and Mn-1, respectively. The odd-numbered local wordlines WL1, WL3, . . . , and WLn are connected to the even-numbered global wordlines GWL1, GWL3, . . . , and GWLn through the even-numbered depletion switching transistors M1, M3, . . . , and Mn, respectively. The selection circuit 160*a'* generates two selection signals SWSae and SWSao respectively assigned to the sections 140*ae* and 140*ao*. SWSae is coupled to gates of the even-numbered depletion switching transistors M0, M2, . . . , and Mn-1, and SWSao is coupled to gates of the odd-numbered depletion switching transistors M1, M3, . . . , and Mn. The arrangement shown in FIG. 8 may provide a topological or routing margin in disposing the decoders, in the case of a very narrow wordline pitch. When in the programming/read-out operation mode the even-numbered wordlines are selected, SWSae is set on 9V/4.5V while SWSao is held at 0V for the unselected odd-numbered wordlines, reducing the burden of pumping the voltages.

As described above, since the local decoder of the invention employs one depletion transistor to connect a global wordline to a local wordline, the circuit area required for constructing decoders is reduced to lighten a burden of layout design. Furthermore, sectional disposition of the even and the odd local decoders and sector selection circuits reduces current consumption in the memory device, as well as providing topological margin in designing the circuit architecture.

This invention may be embodied in different forms and should not be construed as limited to the embodiments set forth herein. Rather, these embodiments are provided so that this disclosure will be thorough and complete, and will fully convey the scope of the invention to those skilled in the art.

What is claimed is:

1. A nonvolatile semiconductor memory device having a plurality of memory sectors each of which is formed of a plurality of memory cells, the device comprising:
   a plurality of first wordlines;
   a plurality of second wordlines coupled to the memory cells, the second wordlines being assigned to each of the memory sectors;
   a plurality of first transistors each of which connects a first wordline to a second wordline;
   a circuit for controlling the first transistors in common, wherein the circuit causes one of the first wordlines to be connected to one of the second wordlines through a corresponding one of the first transistors;

a redundant memory sector formed of a plurality of redundant memory cells which are coupled to redundant wordlines via a plurality of second transistors, each of the redundant wordlines being connected to a first wordline through a corresponding second transistor;

a circuit for controlling the second transistors in common; and a decoding circuit for selecting the first wordlines and having a fuse to isolate the first wordline from a voltage source when the first wordline is involved in a defect.

2. The device of claim 1, wherein the first transistors are of depletion type having a negative threshold voltage.

3. The device of claim 1, wherein the second transistors are of depletion type having a negative threshold voltage.

4. The device of claim 1, wherein the decoding circuit includes an electrical path to establish the first wordline at a predetermined voltage level when the first wordline is involved in the defect.

5. A nonvolatile semiconductor memory device having a plurality of memory sectors each of which is formed of a plurality of memory cells, the device comprising:

a plurality of first wordlines;

a plurality of second wordlines coupled to the memory cells, the second wordlines being assigned to each of the memory sectors;

a decoding circuit for selecting the wordlines and having a fuse to isolate a first wordline from a voltage source when the first wordline is involved in a defect;

a local decoder divided into two sections each assigned to a corresponding one of two groups of the second wordlines; and a selection circuit for generating two selection signals each assigned to a corresponding one of the two sections of the divided local decoder, wherein the divided local decoder comprises a first group of transistors for connecting a first group of the first wordlines to a first group of the second wordlines, and a second group of transistors for connecting a second group of the first wordlines to a second group of the second wordlines;

wherein the selection circuit separately controls the first and second groups of transistors; and wherein one of the first wordlines is connected to one of the second wordlines through one of the transistors of the first or second group of transistors.

6. The device of claim 5, wherein one of the transistors is a depletion type having a negative threshold voltage.

7. The device of claim 5, further comprising:

a redundant memory sector formed of a plurality of redundant memory cells which are coupled to redundant wordlines, the redundant wordlines being connected to the first wordlines through a third group of transistors; and a circuit for controlling the third group of transistors in common.

8. The device of claim 7, wherein the transistors of the third group of transistors are of depletion type having a negative threshold voltage.

9. The device of claim 7, wherein the decoding circuit includes an electrical path to establish the first wordline at a predetermined voltage level when the first wordline is involved in the defect.

* * * * *

UNITED STATES PATENT AND TRADEMARK OFFICE
CERTIFICATE OF CORRECTION

PATENT NO.    : 6,542,406 B2
DATED         : April 1, 2003
INVENTOR(S)   : Byeon et al.

It is certified that error appears in the above-identified patent and that said Letters Patent is hereby corrected as shown below:

Column 2,
Line 9, "signals S1" should read -- signals Si --.
Table 1, Column Header "Selected Sector", "S1" should read -- Si --.

Column 4,
Lines 31-32, "decoders 140a-140c are arranged by each of the sectors 100a-100c" should read -- decoders 140a~140c are arranged by each of the sectors 100a~100c --.

Column 5,
Table 2, "    ~|Vtmp" should read -- ~|Vtmp|

|

~|Vtmp            ~|Vtmp|--.

|

Column 6,
Line 28, "understood." should read -- understood). --.

Signed and Sealed this

Second Day of March, 2004

JON W. DUDAS
*Acting Director of the United States Patent and Trademark Office*